United States Patent [19]

Roos

[11] 4,052,747

[45] Oct. 4, 1977

[54] DEVICE FOR THE MAGNETIC DOMAIN STORAGE OF DATA HAVING A SHIFT REGISTER FILLED WITH CODED SERIES OF DOMAINS

[75] Inventor: Jan Roos, Eindhoven, Netherlands

[73] Assignee: U.S. Philips Corporation, New York, N.Y.

[21] Appl. No.: 661,735

[22] Filed: Feb. 26, 1976

[30] Foreign Application Priority Data

Mar. 3, 1975 Netherlands ............... 7502455
Aug. 15, 1975 Netherlands ............... 7509734

[51] Int. Cl.$^2$ ............................................. G11C 11/42
[52] U.S. Cl. .......................... 360/110; 360/55; 340/174 TF
[58] Field of Search ........... 360/110, 112–113, 360/55, 58; 340/174 TF

[56] References Cited

U.S. PATENT DOCUMENTS

| 3,716,781 | 2/1973 | Almasi et al. | 340/174 TF |
| 3,793,639 | 2/1974 | Enz et al. | 360/55 |
| 3,793,640 | 2/1974 | Potgiesser | 360/55 |
| 3,815,107 | 6/1974 | Almasi | 340/174 TF |

OTHER PUBLICATIONS

"Effect of Abrupt Changes in Film Thickness on Magnetic Bubble Forces" by Collins et al. IBM J. Res. Develop Mar. 1976 pp. 132–137.

"Recording with Magnetic Bubbles" by De Jonge et al. IEEE Transactions on Magnetics, Sept. 1973, pp. 179–182.

*Primary Examiner*—John H. Wolff
*Attorney, Agent, or Firm*—Frank R. Trifari; Carl P. Steinhauser

[57] ABSTRACT

A magnetic bubble domain device for recording information on a magnetizable recording medium including a shift register filled with a series of bubble domains coded in accordance with the information to be recorded, the whole bubble domain pattern being printed, in combination with a magnetic transfer field, in one time on a recording medium, new information replacing the old information by shifting of the bubble domains in the register.

26 Claims, 9 Drawing Figures

DEVICE FOR THE MAGNETIC DOMAIN STORAGE OF DATA HAVING A SHIFT REGISTER FILLED WITH CODED SERIES OF DOMAINS

The invention relates to a magnetic transducing device for recording and reproducing information in a magnetisable recording medium, comprising a layer of magnetisable material in which magnetic bubble domains can be maintained by a field of a main magnetic field generator, said field extending transversely to the layer, which layer is destined to be coupled magnetically with the recording medium for the transducing of information, further comprising a generator for generating magnetic bubble domains in the layer, a bubble domain coding device connected to an information input means, and means to generate a magnetic transfer field having such a field strength and orientation that the required coupling between bubble domain and recording medium is effected.

Such a transducing device is described in the U.S. Pat. No. 3,793,640. In this connection it is to be noted that the properties and possible applications of bubble domains in general are treated in the article "Properties and Device applications of Magnetic domains in orthoferrites" in the Bell System Technical Journal, Volume 6, No. 8, Oct. 1967, pp. 1901-1925.

The operation of the device described in the said U.S. Pat. specification is based on the fact that the component of the field of a single-wall magnetic domain (so-called bubble domain) emerging from the layer at the area of the wall which is parallel to the plane of the magnetisable layer has approximately the same effect on a recording medium as the field in the proximity of the gap of a conventional magnetic head. This effect can be used advantageously to replace in the conventional method of recording, for example, television images, the rotatory scanning head by a stationary scanning head. For that purpose, the known device comprises a bubble domain plate in which a bubble domain is generated and maintained, while a couple of current conveying conductors is provided on the plate to generate a local gradient field to move the domain in a direction transverse to the direction of movement of a recording medium which is transported along the plate. The plate furthermore comprises a bubble domain coding device in the form of a signal lead with which a variable auxiliary magnetic field is produced which, during writing, can vary the length of the wall of the bubble domain as a function of a signal to be recorded. In this manner, information-containing tracks are recorded which extend transversely to the direction of movement of the recording medium.

Apart from the advantage of the above-mentioned bubble domain device that it enables transverse recording by means of a stationary head, it exhibits also certain drawbacks.

On its way transversely across the recording medium a bubble domain easily "adheres" by the interaction with the magnetisation pattern provided in the recording medium by the domain itself, so that its functioning is disturbed.

A further drawback is that a signal lead has to extend transversely across the bubble domain plate because it must be possible to generate a write signal for the bubble domain in each of the information positions (these may be a few hundred) of each track. This makes the system sensitive to interference. Moreover, the necessity in the known device of having to generate the required high frequency signal field over a large region involves considerable problems, in particular with respect to the energy dissipation.

It is the object of the invention to provide a device which does not exhibit the above-mentioned drawbacks. For that purpose, in the device according to the invention the generator is connected to a first shift register for magnetic bubble domains, the bubble domain coding device being designed to fill the shift register with successive coded series of bubble domains, and includes means to effect the coupling between at least one series of bubble domains and the recording medium at desired instants.

In principle the operation of the device according to the invention is based on the filling of a shift register extending through the layer of magnetisable material with an information representing coded series of bubble domains. (the various manners of coding will be described hereinafter). After filling the register, the coupling of the individual bubble domains of the series with the recording medium is effected for transmitting the information. (The various manners of effecting the coupling will be described hereinafter.) The register is thereafter filled with the information for the next track in the form of a new coded series of bubble domains while shifting the preceding series.

The advantages hereof are: adhesion of a bubble domain to the magnetisation pattern "written" by it is no drawback since as a result of the transmission of the information via series of bubble domains, a bubble domain which has once written need not write again, while the sensitivity to interferences is small because the domain pattern to be transmitted is coded only in one place which can readily be screened, namely near the generator, and is further maintained. This instead of the separate coding of the information in each information position as in the known device.

Within the scope of the invention it is possible in various manners to effect the desired coupling between a series of bubble domains and the recording medium.

For that purpose, in a first preferred embodiment of the device according to the invention means are present to continuously keep the layer in contact with the recording medium during operation and the means for coupling comprise a circuit which switches on a magnetic transfer field at desired instants. Herewith a restriction of the dissipation is possible (the transfer field is switched on only once per track to be written).

In a second preferred embodiment of the device according to the invention means are present to continuously generate a magnetic transfer field during operation and the layer is connected to a vibrator which contacts the layer with the recording medium at desired instants. Herewith a smaller wear of the layer of magnetisable material is realized. (Only when the shift register has been filled with the information for a given track to be written is the layer contacted with the recording medium).

The condition that the coupling between a bubble domain series and the recording medium can be effected at desired instants involves that it is possible for example, to cause the information tracks during writing to always begin at the same distance from the edge of the recording medium. For this purpose, the device according to the embodiment may be constructed so that a detector is present for detecting the instantaneous position of an edge of the recording medium, which detector is connected to a circuit for controlling the means effecting the coupling between bubble domains and recording medium.

Within the scope of the invention several manners are moreover possible to code series of bubble domains.

A first manner of coding is to cause the bubble domains to assume a position either on the left-hand side or on the right-hand side of a transport channel. Another manner of coding is to occupy or not to occupy the successive positions of the channel by a bubble domain. Since the positions are shifted the coding is maintained during the shifting.

An alternative possibility is to provide differences in the wall structure of the magnetic bubble domains. For example, the magnetisation in the domain wall may be dextrorotary or levorotary.

Another object of the invention is to provide a device of the above-mentioned kind which is relatively insensitive to wear, in which undesired interactions between bubble domains and recording medium after printing are prevented and with which the detrimental influence of scratches formed accidentally in the layer of magnetisable material by the contact with the recording medium is prevented.

For that purpose, the device according to the invention is preferably constructed so that means are provided to keep during operation the layer of magnetizable material in contact with the recording medium with only a part of its surface, that, viewed in the direction of movement of the recording medium, the shift register is positioned before the contact surface of the layer with the recording medium. A system of bubble domain transporting channels extends transversely to the shift register at least up to the contact surface for the series-wise transportation of bubble domains in a direction transverse to the shift register, and means are present which ensure that the coupling of a coded series with the recording medium takes place at the area of the contact surface.

An extra advantage is presented by the use of a layer of magnetisable material having a two-dimensional domain lattice region. Such domain lattice regions for the realisation of which reference is made to Philosophical Magazine, 31, No. 1, Jan. 1975, pp 161–172, have a very high packing density and thus enable a high information density on the recording medium.

A preferred embodiment of the device according to the invention includes means to simultaneously drive a series of coded bubble domains, always after the shift register has been filled with said domains, in a direction transverse to the shift register for the successive formation of rows of magnetic bubble domains in a two-dimensional domain lattice region. Means for transporting the formed rows in a direction transverse to the shift register are provided, and means are also provided to effect the coupling between at least one row and the recording medium at desired instants.

This preferred embodiment of the device according to the invention is operated such that as soon as the register is filled with the information to be written on one track, the series of bubble domains representing said information are shifted into a two-dimensional domain lattice region. The register is then filled with the information for the next track and a fresh row of bubble domains is shifted into the domain lattice region while moving the preceding row. (During moving, the coding is maintained.) At desired instants, the coupling between a row or a number of rows from the domain lattice region with the recording medium is effected for transducing the information.

In a further preferred embodiment of the device according to the invention the magnetisable layer comprises a first magnetisable sublayer and a second magnetisable sublayer adjoining the first. The generator is constructed to generate domains in each of the sublayers, coinciding magnetic domain pairs being formed in the first and the second sublayers and single domains being formed in the second sublayer under the selective control by the coding device, the first sublayer being adapted to be coupled to the recording medium. In this case the coding is such that in the first sublayer to be coupled with the recording medium a bubble domain can occur (binary "one") or no bubble domain (binary "zero") can occur in the lattice places of the domain lattice region. In order that the structure of the domain lattice region in the first sublayer be not disturbed by open places resulting from the coding, a complete domain lattice region is present in the adjoining (second) sublayer. The complete domain lattice region also serves as a transport means. In fact, when the rows of the complete lattice region are moved, the rows of the incomplete lattice region coupled thereto also move while maintaining the information contained therein.

The two-dimensional domain lattice region may form a hexagonal lattice, while a high information density is ensured in that the lattice constant is smaller than two and a half time the cross-section of the bubble domain.

At the edge remote from the first shift register the domain lattice region should be bounded. This can be done by providing the domain lattice region at the said edge with a row of domain annihilation units in which all the domains of a row arrived there are annihilated simultaneously.

In a further preferred embodiment of the device according to the invention, however, the domain lattice region is bounded by a second shift register which is arranged parallel to the (first) shift register, in which second shift register bubble domains and coinciding bubble domain pairs, respectively, from the domain lattice region can be incorporated laterally and then be transported further. Now, only one annihilation unit will suffice at the end of the shift register, while in addition the possibility is created of sequentially detecting, by means of a detector, single or coinciding domains arriving at the edge of the domain lattice region before they are annihilated.

Besides for writing information, the device according to the invention may hence also be used for reading.

In a further preferred embodiment of the device according to the invention a detector for the individual detection of single domains and coinciding domain pairs, respectively, is arranged at the end of the second shift rgister, possibly succeeded by a domain annihilating unit. The bubble domain generator is designed to generate coinciding bubble domain pairs in the first. The second sublayer and the magnetic transducing field during the reading phase has a strength which together with the strength of information representing fields pesent locally on the recording medium is sufficiently large to annihilate bubble domains in the first sublayer.

During operation, the magnetic transmission layer is preferably in contact with the recording medium only with a part of its surface. It depends on the size of said contact surface how many rows of the domain lattice region are coupled simultaneously to the recording medium during a writing or reading phase. This presents the possibility, for example, of coding a high-frequency information signal to be recorded in a number of parallel processable signals having lower frequency which are transferred simulataneously to the recording medium via a corresponding number of successive rows of the domain lattice region.

The invention will now be described in greater detail, by way of example, with reference to the accompanying drawings, in which FIG. 1 shows a simplified form, partly as an elevation, partly as a block diagram, of an embodiment of a magnetic recording device according to the invention having a bubble domain sheet 1 and a recording medium 4.

Figure 1:
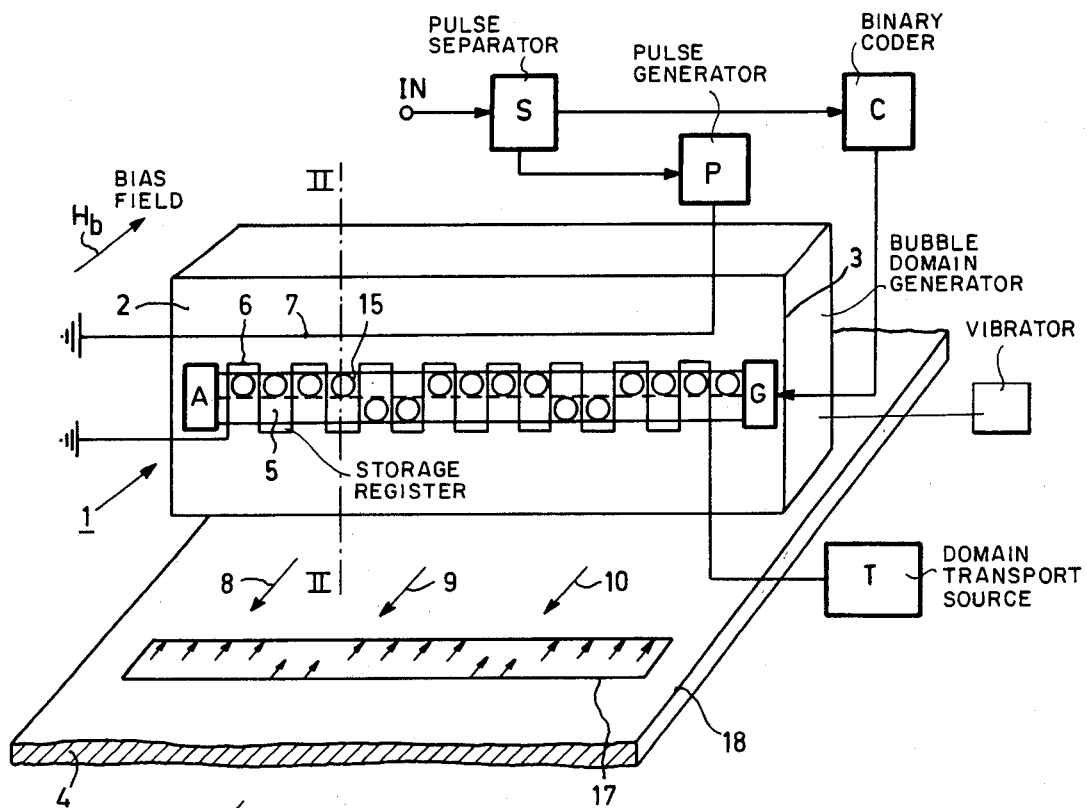

In the device for recording information on a magnetisable recording medium shown in FIG. 1, a so-called bubble domain plate 1 is used the side 2 of which has a bubble domain generator G, a bubble domain transport channel (shift register) 5 and a bubble domain annihilator A and the side 4 of which is adapted to be brought in magnetic flux coupling with a magnetisable recording medium. Certain types of bubble domain transport channels are described in the published French patent application No. 2,155,954. In FIG. 1 the recording medium is shown as a magnetic tape 4. For clarity, the plate 1 is drawn in a position which is rotated 90° relative to the position it actually assumes. During the recording of information, the magnetic tape 4 is moved past the plate 1 in the direction of the arrow v. In the present example it is assumed that the plate 1 and the tape 4 form part of a video recorder and the information to be recorded consists of video information. However, the invention is not restricted to the use in video recorders. The video information is supplied to the input IN of the separator S which separates the pulses of the video signal necessary for the synchronization of the device. In the coding device C the video signal is converted into a binary signal. With this signal the generator G is controlled so as to continuously move a coded series of bubble domains into the transport channel 5. The broken line denotes the axis of the channel. The control signal ensures that upon leaving the generator G the bubble domains go either on the left or on the right-hand side in the transport channel 5, viewed in the direction of movement, or that the bubble domains are intermittently moved into the transport channel 5. FIG. 1 shows one generator G and one transport channel 5.

However, the invention is not restricted to this. In general it will be preferable to use a number of parallel transport channels with associated generators, the — high frequency — video signal being split into a number of parallel processable signals haing lower frequency. If this is not done, a rather high bit rate will be necessary due to the necessary digitization of the video signal. For example, at a frequency of the video signal of 5 MHz the required bit rate would be 50Mbit/sec.

The bubble domains which are generated by the generator G, one of them being shown by reference numeral 15, are transported through the channel 5 by means of the so-called meander method. For that purpose, a number of meander-shaped current wires, of which only the wire 6 is shown for clarity, are provided on the side 2 of the plate 1, through which wires currents flow which are controlled by the domain transport source T. The channel 5 is formed by a groove in the plate 1. Other current conductor configurations, possibly in combination with soft magnetic strips, may also be used for transporting the domains. See for example the article "Theory of single-current domain propagation circuit" in IEEE Transactions of Magnetics, June 1972, pp 241-243, as well as the U.S. Pat. No. 3,460,116.

When the channel 5 is filled with a series of bubble domains, a magnetic transfer field is applied for a short period of time which together wth the strongly concentrated wall field of the bubble domains, locally reaches a field strength which exceeds the coercive field strength of the magnetic tape 4. For generating this transfer field, an electric conductor 7 is provided on the plate 1 and is connected to a pulse generator P. The direction of the transfer field is opposite to the direction shown by the arrow 8, 9 and 10 in which the tape is premagnetized.

A bias field will generally also be necessary in order to stabilize the bubble domains. The means to generate said field are not shown in FIG. 1. The direction of said bias field is shown by the arrow $H_b$.

Figure 2:
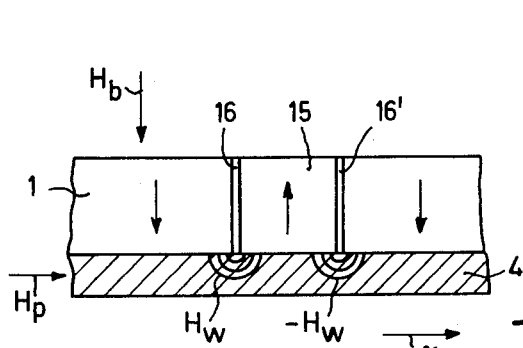
FIG. 2 is a sectional view taken on the line II—II of the sheet 1 and the recording medium of FIG. 1.
Figure 3:
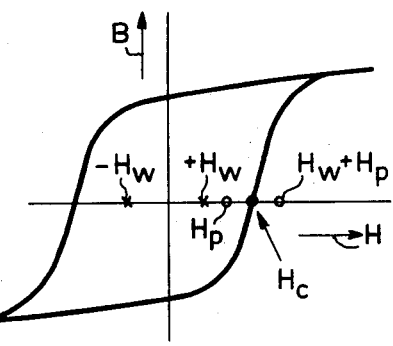
FIG. 3 shows the B-H curve of the recording medium of FIG. 1 in which the field strength H is plotted horizontally and the magnetic induction B is plotted vertically.

The manner in which the information which a series of bubble domains contains is "printed" on the magnetic tape 4 will be described in greater detail with reference to FIGS. 2 and 3. FIG. 2 is a cross-sectional view taken on the line II—II of a part of the bubble domain plate 1 of FIG. 1 (in its operational position) at the region of the bubble domain 15 when it is in a flux coupling position in relation to the recording medium 4. The bubble domain produces a horizontal field in the recording medium at the area of the contact line of the wall 16, 16' and recording medium, which field differs little from the field pattern around a fictitious current wire through which a current constantly flows. In the embodiment shown the field of the wall 16 has the same sense as the print field $H_p$ while the field of the wall 16' has the opposite sense.

Thus the "overall" transfer (print) field $H_p$ and the concentrated stray field "below" the wall 16 add, while the field "below" the wall 16' is subtracted from the print field $H_p$. When only the field in the direction of movement v of the tape 4 is considered, the fields of the domain walls 16 and 16', respectively, are given by $H_w$ and $-H_w$. This is explained in FIG. 3 with reference to the B-H characteristic of the magnetic tape 4. When the print field is switched on, the field strengths exactly below the domain walls 16 and 16', respectively, are $H_w + H_p$ and $-H_w + H_p$, respectively. Outside the field area of the domain wall 16, 16' the horizontal component of the field strength is equal to $H_p$. The local reversal of the magnetisation of the — premagnetized — tape 4 must therefore take place at a field strength between $H_p$ and $H_p + H_w$. In this connection it is to be noted that the premagnetized tape 4 has the disadvantage of a high noise level compared with the noise level of an erased tape. On the other hand, the use of a previously raised tape, however, requires a more accurate choice of $H_w$ and $H_p$.

The print field is switched on for a very short time, so that outside the switch-on periods the bubble domains cannot record on the tape 4.

However, not only is the action of a bubble domain on the tape, that is recording, possible, but also the reaction of the recorded information on a bubble domain is possible. When a bubble domain has recorded in the recording phase, it may happen that the interaction between the bubble domain and the poles of the pattern on the tape which the bubble domain itself has recorded is so strong that the bubble domain "adheres" as it were to the tape, so that shifting of the domain in the transport channel, which is necessary to fill the channel with a fresh series of domains, is impeded. In this case it may be advantageous not to annihilate the domains one by one at the end of the transport channel, but rather to annihilate them all at the same time immediately after printing by means of an annihilator extending parallel to the transport channel.

In the embodiment shown in FIG. 1, an annihilator A which successively annihilates the bubble domains of a recorded series when the next series is shifted into the channel 5, is located at the end of the channel 5. The periodic switching-on of the print field is controlled by synchronization pulses which are derived in the separator S from the complete input (video) signal.

In an alternative recording device, the print field is arranged to be switched on continuously and the bubble plate 1 is mounted on a vibrator, for example a piezoelectric vibrator, which vibrates at such a frequency that each time the channel is filled with a fresh bubble series the side 3 of the plate 1 is brought into contact with the tape 4. An advantage of this device is that there is less wear of the plate 1 than if the plate 1 is arranged to be in constant contact with the tape 4.

In FIG. 1 a track 17 is shown diagrammatically which is obtained by recording with a series of bubble domains. This track is a true reproduction of the information present in such a bubble domain series.

An extra advantage of the recording device described above with reference to FIGS. 1 to 3 is that the instant of recording of the bubble domain series is under control. This means that certain errors for example, fluctuations in the position of the tape transversely to the direction of movement, or defects in the tape travel can be corrected for. Within the scope of the invention it is possible, for example, to choose the instant of recording so that the distance from the beginning of the track 17 to the edge 18 of the tape 4 is always the same in spite of possible fluctuations in the position of the tape 4 transversely to the direction of movement $v$. This considerably facilitates the later reading of the recorded information. For this purpose, the device may be provided with a detector which continuously detects the position of the edge of the magnetic tape and is connected to a circuit for controlling the means which effect the coupling between the bubble domain and the recording medium.

As a result of the contact with the tape 4 moving in the direction $v$, scratches may be formed in the side 3 of the domain plate 1. Such scratches extend in the direction $v$ and are thus at right angles to the direction of propagation of the bubble domains in the transport channel 5. This means that, as a result of such scratches, movement of the bubble domains is seriously impeded and in certain circumstances may even be blocked. Within the scope of the present invention, this problem may be solved in a manner to be described hereinafter.

In order to arrive at a description of the preferred embodiment of the device according to the invention which provides the required solution, first the physical properties of magnetic bubble domains, and in particular the generation and manipulation thereof in a two-dimensional domain lattice region, should be further explained.

1. Physical properties

The bubble domains to be used in the preferred embodiment of the device according to the invention can be generated in a two-layer structure of yttrium-iron garnet (YIG) having a composition according to formula $Y_3Fe_5O_{12}$ which is formed in the liquid phase by epitaxial growth so that the layers structurally form one assembly in that the crystal lattice constants with a leap in the composition show only a small difference. The crystal has a mainly cubic structure with three subcrystal lattices in which other ions can be substituted (without the structural assembly being interrupted), namely the dodecahedron subcrystal lattice which is formed by the yttrium ions (substitution by La, Ca, Ga, Sm, Nd, Pr, Gd, Eu), the octahedron subcrystal lattice which is formed by 40 % of the iron ions (substitution by Ga, Al) and the tetrahderon subcrystal lattice which is formed by the remaining 60% of the iron ions (substitution by Ga, Al, Ge, Sr). The list of substitution elements serves as an example. In connection with the valency of the ions, extra substitution in the dodecahedron places is necessary in some cases for charge compensation. The magnetic operation of the dodecahedron subcrystal lattice may often be neglected, as well as the magnetic influence of the oxygen ions. Then the overall magnetisation in said ferri-magnetic garnets is equal to the vectorial sum of magnetisation of the subcrystal lattices which are directed oppositely entirely or substantially entirely. The substitution plce is determined by the relative dimensions of the ions. When the overall magnetisation at a given temperature is near to zero, the value thereof depends critically on the distribution of the ions between the octahedron and tetrahedron subcrystal lattices. The condition M (magnetisation) = O defines a very thin antiferromagnetic region (pseudo-compensation area). As a non-magnetic substrate layer a gallium-gadolinium-garnet layer is usually used. The thicknesses of the layers of magnetic material may be around 5$\mu$m or less.

The invention is otherwise not restricted to the use of layers made via the LPE (liquid-phase epitoxy) process. It is also possible to sputter (amorphous) layers. This presents the possibility of first providing a domain guide structure on the non-magnetic substrate layer (which in that case may be a glass plate) before the layers of bubble domain material are sputtered. The bubble domain layers are separated by a magnetic compensation wall.

A movable densely packed lattice of bubble domains may now be generated in one of the layers. Bubble domains may be generated or may not be generated in the second layer opposite to the bubble domains of the first layer. In those cases where a bubble domain is present in both layers, we refer to a coinciding domain pair. Coinciding domain pairs constitute stable configuration with relation to the mutual displacement of the composing domains. Said domains are connected by a magnetic compensation wall.

2. The generation of the domains

There are several methods of generating magnetic domains. For example, a domain can be split by a local influencing of the main magnetic field. Within a current loop there exist two separated preferential positions for a domain which are generated, for example, by small patches of permalloy vapour-deposited on the layer of magnetic material. By reducing the locally present main magnetic field, a domain present becomes so large that both preferential positions are occupied. The domain is split by a local increse of the main magnetic field in which a split domain can automatically be dissipated outside the current loop along a rail-like preferential structure for domains.

In another method an original domain is continuously present on a mainly square element of permalloy vapour-deposited on the layer of magnetic material. This element adjoins a propagation structure of the T-I type. With each cycle of a rotary magnetic field rotating in the plane of the plate, a domain is split and transported further along the said preferential structure. By the timely reversal of the direction of rotation of the rotary magnetic field, alternating elements can be activated so that the track to be followed by the split domain is controlled selectively. In this manner the information content of a formed series of domains can be modified.

The magnetic domains for use in a device according to the invention can be generated in a corresponding manner. A multiple layer of magnetic materials, at low intensity of the main magnetic field, may be filled with strip-shaped domains in which the magnetisation of successive strips alternate and are parallel and anti-parallel to the main magnetic field. Dependent on the temperature and the thicknesses and compositions of the various layers, the transition occurs to the circular magnetic domains (so-called bubble domains).

Starting from a stable configuration with coinciding domain pairs and when the main magnetic field is locally or everywhere increased, first coinciding domain pairs can be converted into single domains before they implode with an even stronger field. The two transitions occur, for example, in a magnetic double layer having a nominal composition $Y_{2.85}La_{0.15}Fe_{3.75}Ga_{1.25}O_{12}$ at a given temperature at 35.5 and 38.5 oersted, respectively. The difference is sufficiently large for easily effecting the selective conversion of a coinciding domain pair into a single domain. The differences between the two layers with in this case substantially the same composition are produced by another distribution of the substitution ions between the various subcrystal lattices. The distribution can be influenced, for example, by the temperature of the bath in the epitaxial growth process. The stability regions depend on the thicknesses and compositions of the layers of magnetic material and on the temperature. When a conversion is effected by increasing the field, this cannot be inverted in a subsequent reduction of the magnetic field.

Figure 4:
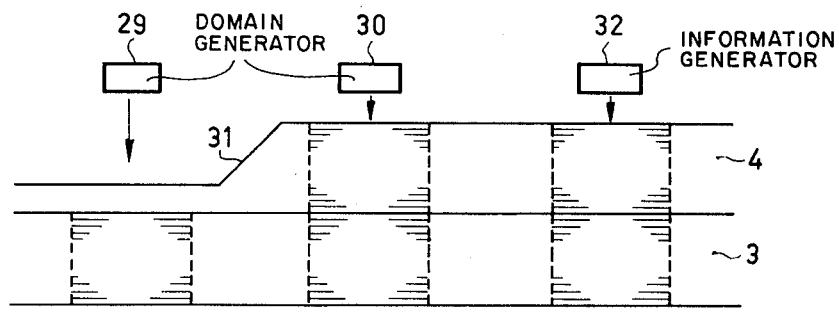
FIG. 4 shows an example of a device for generating magnetic domains and coinciding domain pairs in the form of a sectional view.

FIG. 4 shows a device for generating various types of magnetic domains. The elements 29 and 30 are generators, for example, of an above-mentioned type. At the area of the generator 29 the thickness of the layer 4 is insufficient to maintain a stable domain, in contrast with the local thickness of the layer 3 and the thicknesses of both layers at the area of element 30. Upon energizing element 29, a single domain is formed, upon energizing element 30 on the contrary, a coinciding domain pair is formed. The device may furthermore comprise a domain guide structure, for example, one that consists of discrete vapour-deposited elements of the T-I type of permalloy. This structure is now shown separately. The domain pairs are generated in the source 30 and driven to the information generator 32. This element comprises an energisable current loop by which the main magnetic field is intensified so that a passing coinciding domain pair can change into a single domain in the layer 4. The single domains of element 29, the domain pairs of element 30, the single domains of element 32 and possibly empty domain positions can be driven collectively as a multiple series to combination points at an output of which a single series of domain positions is formed. On the other hand the elements 29, 30, 32 can also be arranged successively along a single guide structure: the slope at 31 exerts substantially no opposing force on a domain in the layer 3 which in the Figure moves from the left to the right. In a corresponding manner a domain generator of the type of element 29 may be arranged at a location where layer 3 is too thin (or possibly too thick) to be able to store stable domains in it.

3. The domain lattice region

Figure 5:
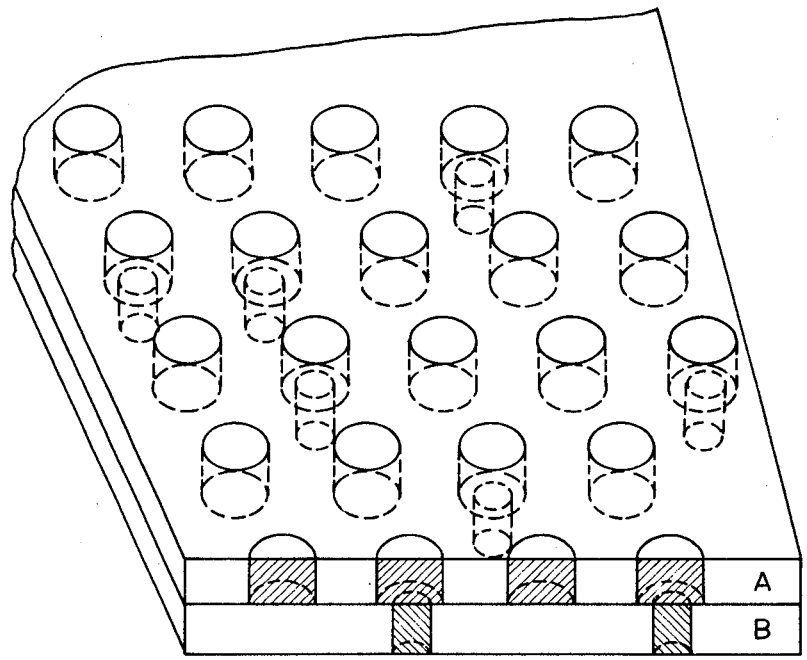
FIG. 5 is a perspective view of a domain lattice in dense packing with single domains and coinciding domain pairs.

FIG. 5 is a perspective view of a domain lattice in a dense packing with single domains and coinciding domain pairs. The magnetic domains in the layer A constitute a fully occupied domain lattice in a dense packing. In a position corresponding to a domain position in the layer A, a domain may be present or may not be present in the layer B. In this manner, a densely packed lattice is formed with a very great stability. In the device according to the invention, recording medium.

Figure 6:
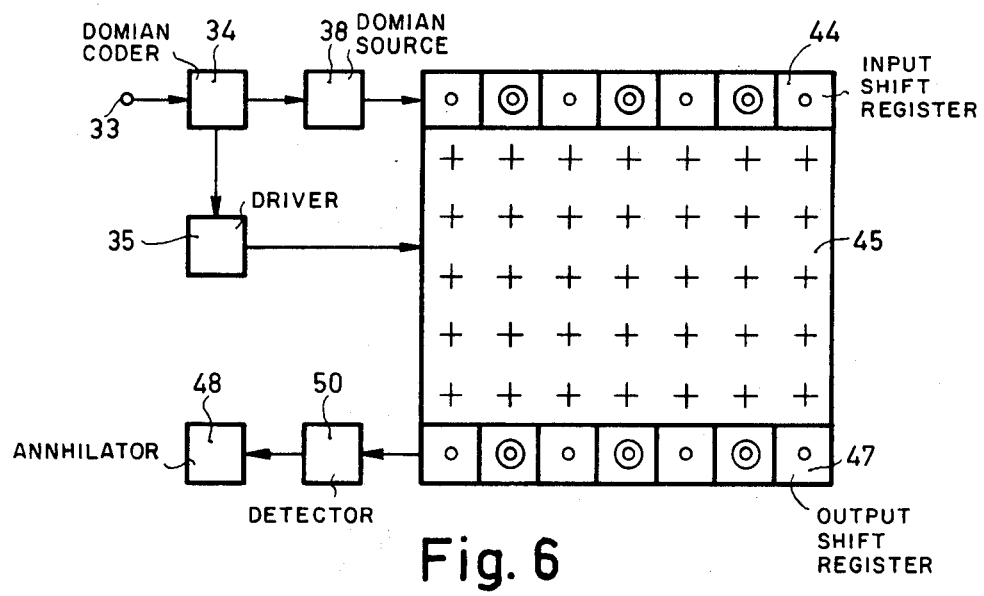
FIG. 6 is a block schematic diagram of a device according to the invention.

FIG. 6 shows diagrammatically a device according to the invention and comprises an information input terminal 33, a domain coding device 34, a driving device 35, a source device 38, an input shift register 44, a domain lattice device 45, an output shift register 47, a domain annihilating element 48 and a domain detector 50. The first and second layers of magnetic material are not shown individually.

The binary coded input information arrives at the information input terminal. The source device 38 operates as the source device 32 in FIG. 4 and produces a flow of pairs of magnetic bubble domains placed one above the other, for example, by means of splitting off a so-called "pilot flame" domain. When the source 38 is energized by a signal of the domain-coding device 34, a coinciding domain pair present at that area is converted into a single bubble domain in a second layer of magnetic material. The single magnetic domains in the second layer of magnetic material and the coinciding domain pairs are shifted as a single information flow in the first shift register 44. The single bubble domains are denoted symbolically by a single circle and the coinciding bubble domains by a double circle. When the driving device 35 receives a signal that the shift register 44 is filled entirely, the domain lattice region 45 is energized so that all domains present therein and empty domain places slide downwards over one row and that the shift register 44 is emptied.

The driving device 35 is activated periodically to move the domain population of the domain lattice region 45 over one row. At the edge of the domain lattice region 45 opposite to the shift register 44 the rows are successively incorporated in the second shift register 47 and moved therein to the domain annihilator 48. A detector 50 which detects whether single or coinciding bubble domains pass may be present in front of the domain annihilator 48.

The domain lattice shown is rectangular and this wll be advantageous in certain cases. Upon transferring video information, however, the rows must comprise a few hundred positions, while the number of rows is restricted to, for example, ten, dependent upon the number of rows which it is desired to couple to the recording medium each time. In that case a hexagonal lattice may advantageously be used in which the domains push up each other.

4. The manipulation of the magnetic domains

Figure 7:
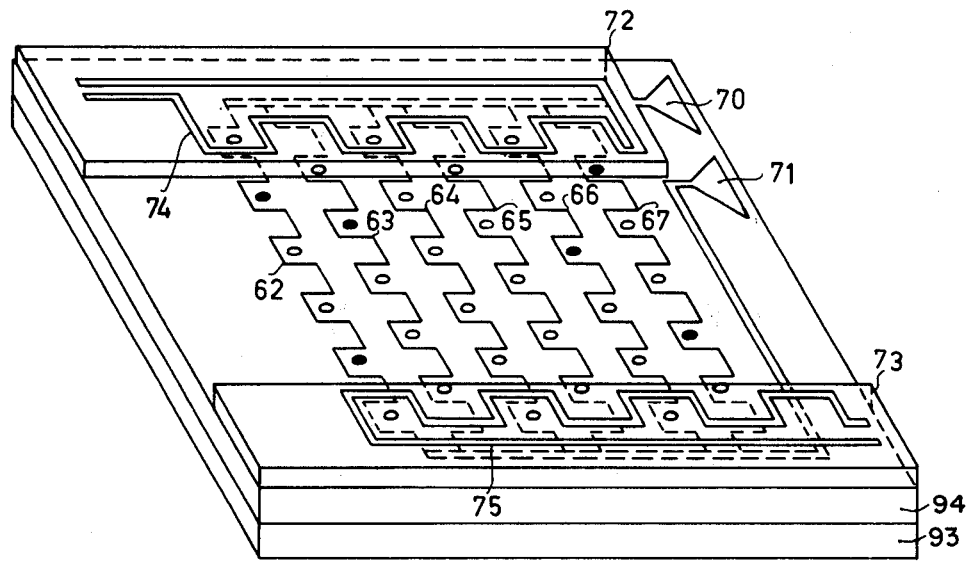
FIG. 7 is an elaborated detail of the device according to the invention in which the magnetic domains are driven by electric current pulses in meander conductors.
Figure 8:
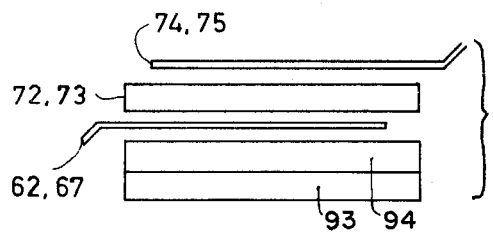
FIG. 8 is a diagrammatic cross-sectional view of a device shown in FIG. 7.

FIG. 7 shows a further elaborated device according to the invention. Shown in this example are two layers 93 and 94 of magnetic material structurally forming one assembly. In this simple example, both single magnetic domains are shown, namely those in layer 94 (circles) and double magnetic domains are shown in the layers 93 and 94 (dots). A first pattern of meander-shaped conductors 62, 63, . . . 67 which are connected in parallel by a collective current inlet 70 and a collective current outlet 71 is provided on the layer 4. So the lines 70, 71 can be connected to a driving device 35 shown in FIG. 6. Two strips of insulation material 72, 73 are provided on the first pattern of meander-like conductors. If desired, said strips may cover the entire plate. The meander-like conductor 74 is present on the strip 72 by which the input shift register is formed. The meander-like conductor 75 is present on the strip 73 by which the output shift register is formed. For clarity, the Figure is kept diagrammatic. In fact, the meander 74 co-operates with a meander (not shown) shifted over half a cycle, meander 74 seving the odd lattice places and the meander not shown serving the even lattice places. The same applies to the meander 75. For clarity, FIG. 8 is a sectional view through the device shown in FIG. 7 in which by an artificial separation of the elements of like reference numerals in FIG. 8 a greater clarity is endeavoured.

Although the dimensions of a meander loop are, for example, approximately equally large or slightly larger, for example 1.3; times the diameter of the magnetic domain or coinciding domain pair, FIG. 7 shows a slightly different configuration. The meander-like conductors 62–67 in which the domains are shown symbolically only, have comparatively small loops which have a pitch, for example, equal to the domain cross-section. The formation of a domain lattice is achieved in that said meander-like conductors show an alternating symmetry.

5. A preferred embodiment of the device according to the invention

Figure 9:
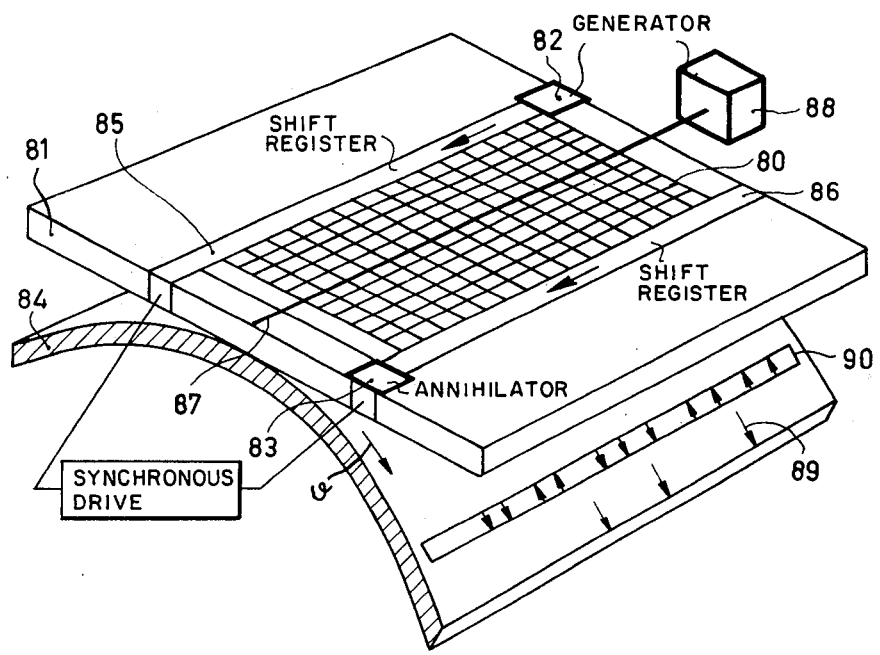
FIG. 9 is an elevation of a preferred embodiment of the device according to the invention.

FIG. 9 shows a transducing device in which for clarity the components described in FIGS. 5, 6 and 7 are omitted. Essential for the invention is the magnetic layer 81 which is a constituent of plate 1 in which a two-dimensional bubble domain lattice 80 is maintained. The means for maintaining the bubble domains, a permanent magnet or electrically energized coil, are now shown. The recording medium 84 is passed along the layer 81 in a curved track so that the layer contacts the recording medium only over a part of its surface. The recording medium 84 moves in the direction denoted by the arrow v and is premagnetized in the direction denoted by the arrow 89. Upstream with respect to the contact area a bubble domain generator 82 is arranged with which in a manner described above, coded bubble domains are shifted into the shift register 85. Rows thus formed are further transported in the domain lattice region 80 transversely to the shift register. When a row or a number of rows of which the information is to be transferred to the recording medium 84 has arrived at the area of the contact region, a pulse field generator 88 is switched on for a short period of time and energizes an electric conductor 87. In those places where bubble domains contact the recording medium, the magnetisation of the recording medium 84 is locally inverted by the collective influence of the bubble domain stray field and the field generated by the electric conductor 87. A track written in this manner is denoted by reference numeral 90. After the transducing step, the rows are further transported to the shift register 86, incorporated therein and conveyed to the annihilation unit 83. The transport of the rows after the transducing step is facilitated in that the bubble domains remain adhering slightly to the information recorded on the recording medium 84 and are "dragged along" by it in the direction of the shift register 86. A detector may possibly be present between the annihilation unit 83 and the shift register 86, which detector can distinguish between the kind of bubble domains passing (for example single or coinciding domains). During a reading operation, bubble domains of one kind (for example coinciding) are controlled in the shift register 85 by the generator 82. They are moved in rows in the lattice region 80. During the transducing phase a transmission field is generated by means of the generator 88 and the conductor 87, which field is just not strong enough to convert coinciding domains into single domains, but is strong enough indeed together with the field of a "one" recorded on the recording medium. In this manner, coded bubble domains arrive in the shift register 86 which can be detected in sequence by the above-mentioned detector.

The great advantage of the preferred embodiment of the device according to the invention shown in FIG. 9 is that in the region where scratches can be formed in the domain plate the domains are moved parallel to the scratches and can thus not be hindered seriously by the scratches. The moving in the channel 85 can take place undisturbedly for at the area of the channel 85 the sheet 81 does not contact the tape 84. (It is, of course, alternatively possible to give the sheet 81 a certain curvature instead of moving the tape 84 along a curved path. What matters is that the sheet 81 contacts the magnetic tape 84 only with a part of its surface.)

A further advantage is that possible adhering of the bubble domains to the tape 84 after recording is not disadvantageous because it does not impede the shifting of the new information into the main channel 85. The adhering even facilitates the transport to the channel 86.

In the above-described preferred embodiment the use of a two-dimensional domain lattice region offers great advantages as regards packing density and transportability of the bubble domain series. As already briefly indicated, said preferred embodiment may also be constructed with a system of transport channels extending transversely to the (first) shift register so as to transport bubble domain series in the direction of movement of the recording medium to the position where they are printed.

The idea of moving bubble domain series prior to printing, either by means of a system of parallel trnsport channels, or in a two-dimensional domain lattice region, still has an extra aspect. With respect to the velocity with which the (first) shift register is filled, the velocity with which the bubble domain series are transported in the direction of movement of the recording medium is comparatively slow. (As it were they travel along with the recording medium.) During reading, said transport velocity can slightly be adapted at will so that no phase leap occurs in the signal of the read out detector after processing of a picture line, c.q. a series of bubble domains. From the succession of synchronization pulses and codings possibly provided extra at the beginning and end of a track, such a transport velocity of the bubble domain series can be derived that phase errors can be prevented entirely.

What is claimed is:

1. A magnetic transducing device for recording information in a magnetizable recording medium and for reproducing the information recorded therein, comprising a layer having a layer of magnetizable material, means for maintaining magnetic bubble domains in said layer including a main magnetic field generator, a field produced by said generator extending transversely to the layer, said layer being adapted to be coupled magnetically with the recording medium for transducing of information, means for generating magnetic bubble domains in the layer, an information input means, a bubble domain coding device connected to said information input means, and means to generate a magnetic transfer field having a field strength and orientation at which the required coupling between the bubble domain and the recording medium is effected, a first shift register for magnetic bubble domains, said magnetic bubble generator means being connected to said first shift register, said bubble domain coding device comprising means for filling the shift register with successive coded series of bubble domains, and means for effecting the coupling between at least one series of bubble domains and the recording medium at desired instants.

2. A device as claimed in claim 1, including means to continuously keep the layer in contact with the recording medium during operation and wherein said latter coupling means comprises a circuit which switches on a magnetic transfer field at desired instants.

3. A device as claimed in claim 2 wherein the magnetic transfer field has a direction substantially parallel to the plane of the layer.

4. A device as claimed in claim 3 wherein the magnetic transmission field has a field strength which, together with the field strength of the field emanating from the first sublayer at the area of the wall of a magnetic bubble domain, is larger than the coercive force of the recording medium.

5. A device as claimed in claim 1, including means to continuously generate a magnetic transfer field during operation, and a vibrator, the layer being connected to the vibrator which contacts the layer with the recording medium at desired instants.

6. A device as claimed in claim 1 wherein the shift register comprises a bubble domain transporting channel and the coding device comprises means to give each bubble domain, as soon as it arrives in the channel, a deviation to the left or to the right viewed in the longitudinal direction of the channel, according to a binary coded signal to be recorded.

7. A device as claimed in claim 1 wherein the shift register comprises a bubble domain transporting channel and the coding device comprises means to intermittently fill the channel with bubble domains according to a binary coded signal to be recorded.

8. A device as claimed in claim 1 wherein the coding device rotates the magnetization in the wall of the bubble domains to the left or to the right in accordance with a binary coded signal to be recorded.

9. A device as claimed in claim 1 including a bubble domain annihilator at the end of the shift register.

10. A device as claimed in claim 1 wherein a bubble domain annihilator extends parallel to the shift register and annihilates bubble domain series entirely.

11. A device as claimed in claim 1 including means to maintain, during operation, the layer of magnetizable material in contact with the recording medium with only a part of its surface, which, viewed in the direction of movement of the recording medium, the shift register is positioned before the contact surface of the layer with the recording medium, a bubble domain transporting channel extending transversely to the shift register at least up to the contact surface for the series-wise transportation of bubble domains in a direction transverse to the shift register, and means for coupling a coded series with the recording medium at the area of the contact surface.

12. A device as claimed in claim 11 wherein the system of transport channels extends to beyond the contact surface and a bubble domain annihilator is provided at the end of said transporting channel.

13. A device as claimed in claim 11 including means for adjusting the velocity at which bubble domain series are transported transversely to the shift register.

14. A device as claimed in claim 1 including a detector for detecting the instantaneous position of an edge of the recording medium, said detector being connected to a circuit for controlling the means which effect the coupling between the bubble domain and the recording medium.

15. A device as claimed in claim 1 including means to simultaneously drive a coded series of bubble domains, always after the shift register has been filled with said domains, in a direction transverse to the shift register fo the successive formation of rows of magnetic bubble domains in a two-dimensional domain lattice region, means for transporting the formed rows in a direction transverse to the shift register, and means for effecting the coupling between at least one row and the recording medium at desired instants.

16. A device as claimed in claim 15 wherein the magnetizable layer comprises a first and a second magnetizable sublayer adjoining the first sublayer, the generator generating domains in each of the sublayers, coinciding magnetic domain pairs in the first and the second sublayer and single domains being formed in the second sublayer under selective control by the coding device, the first sublayer being adapted to be coupled to the recording medium.

17. A device as claimed in claim 16 wherein the said sublayers each have at least two magnetic sub-crystal lattices having within a layer each time complementary first and second magnetisations which have substantially opposite directions.

18. A device as claimed in claim 15 including means to limit the domain lattice region at an edge remote from the shift register.

19. A device as claimed in claim 18 wherein the means for limiting the domain lattice region comprise a second shift register which is arranged parallel to the said first shift register, bubble domains and coinciding bubble domain pairs, respectively, from the domain lattice region being incorporated laterally and transported further in said second shift register.

20. A device as claimed in claim 19 including means to drive the second shift register synchronously with the said first shift register.

21. A device as claimed in claim 19 including a detector for the respective detection of single bubble domains and coinciding domain pairs, respectively, positioned at the end of the second shift register, the bubble domain generator generating coinciding domain pairs in the first and second sublayers, the magnetic transfer field during the reading phase having a field strength which together with the strength of information representing fields present locally on the recording medium being sufficiently large to annihilate bubble domains in the first sublayer.

22. A device as claimed in claim 19 including an annihilating unit for annihilating single bubble domains and coinciding domain pairs, respectively, positioned at the end of the second shift register.

23. A device as claimed in claim 10 wherein the means to transport the rows of domains transversely to the shift register comprise meander-like conductors extending transversely to the shift register.

24. A device as claimed in claim 15 wherein the domain lattice region forms a hexagonal lattice.

25. A device as claimed in claim 15 wherein the domain has a given cross-section and the lattice constant of the domain lattice is smaller than two and a half times the domain cross-section.

26. A device as claimed in claim 5 wherein the magnetizable layer during operation contacts the recording medium with a part of the surface across which the domain lattice region extends, in such manner that a desired number of rows of the domain lattice region can be coupled to the recording medium.

* * * * *